United States Patent [19]
Barber

[11] Patent Number: 6,008,678
[45] Date of Patent: Dec. 28, 1999

[54] THREE-PHASE MASTER-SLAVE FLIP-FLOP

[75] Inventor: Frank E. Barber, Emmaus, Pa.

[73] Assignee: Lucent Technologies Inc., Murray Hill, N.J.

[21] Appl. No.: 08/844,963

[22] Filed: Apr. 23, 1997

[51] Int. Cl.⁶ .......................... H03K 3/289; H03K 3/356
[52] U.S. Cl. .......................... 327/203; 327/215; 377/117
[58] Field of Search .................... 327/202, 203, 327/215, 216, 217; 377/115, 116, 117

[56] References Cited

U.S. PATENT DOCUMENTS

| | | | |
|---|---|---|---|
| 3,766,408 | 10/1973 | Suzuki et al. | 327/212 |
| 3,812,384 | 5/1974 | Skorup | 327/203 |
| 4,806,786 | 2/1989 | Valentine | 327/203 |
| 4,843,254 | 6/1989 | Motegi et al. | 327/203 |
| 5,170,074 | 12/1992 | Aoki | 327/203 |
| 5,321,399 | 6/1994 | Notani et al. | 327/203 |
| 5,459,421 | 10/1995 | Shaw | 327/211 |
| 5,654,658 | 8/1997 | Kubota et al. | 327/203 |
| 5,719,878 | 2/1998 | Yu et al. | 327/202 |
| 5,783,958 | 7/1998 | Lysinger | 327/202 |

FOREIGN PATENT DOCUMENTS

63-240206  10/1988  Japan ..................... 327/203

Primary Examiner—Timothy P. Callahan
Assistant Examiner—Terry L. Englund

[57] ABSTRACT

A master-slave flip-flop has two switches that control the flow of data into and through the master and slave stages. The switches are controlled by a three-phase clock signal that is designed to address the problem of data shoot-through. Implementations of the flip-flop rely on weak feedback techniques that allow the flip-flops to be implemented using weak keeper devices in the feedback paths of the master and slave stages and without switches in those feedback paths. The flip-flop enables fast and reliable flip-flops to be implemented with minimal layout area and power consumption.

17 Claims, 6 Drawing Sheets

THREE-PHASE MASTER-SLAVE FLIP-FLOP

BACKGROUND OF THE INVENTION

1. Field of the Invention

The present invention relates to electrical circuits, and, in particular, to master-slave flip-flops.

2. Description of the Related Art

A master-slave flip-flop is an electrical device that temporarily stores data, where the data is transferred into and within the device on the edges of clocking signals. The master stage of such a flip-flop stores data (received from an input stream) during one phase of a two-phase clock, and the slave stage stores data (received from the master stage) and presents that stored data as the output from the master-slave flip-flop, on the opposite phase of that clock.

Figure 1:
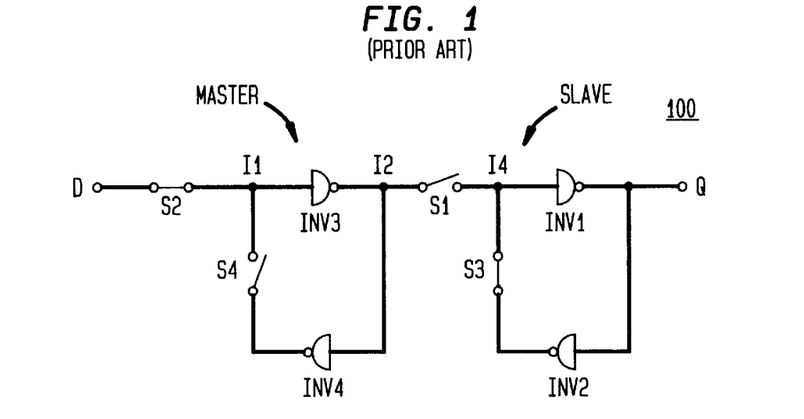
FIG. 1 shows a schematic drawing of a prior-art implementation of a master-slave flip-flop that relies on switched feedback techniques to retain data.

FIG. 1 shows a schematic drawing of a prior-art implementation of a master-slave flip-flop 100 that relies on switched feedback techniques to retain data. Flip-flop 100 comprises inverters INV1–INV4 and switches S1–S4 arranged and operated to move data through flip-flop 100 in a particular manner. Switches S1–S4 are controlled by the levels of a two-phase clock, such that switches S1 and S4 are opened when switches S2 and S3 are closed, and vice versa. When S1 and S4 are opened and S2 and S3 are closed, the master stage receives a data signal from input node D. When S1 and S4 are closed and S2 and S3 are opened, data stored in the master stage is passed to the slave stage. When S1 and S4 are opened again and S2 and S3 are closed again, the data received by the slave stage from the master stage is stored in the slave stage, while the master stage receives a new data signal from node D. In this way, master-slave flip-flop 100 temporarily stores data received from an input data stream.

Flip-flops such as flip-flop 100 of FIG. 1 have certain disadvantages. In particular, the most basic design requires four switches and four inverters, which utilize layout area as well as power.

Figure 2:
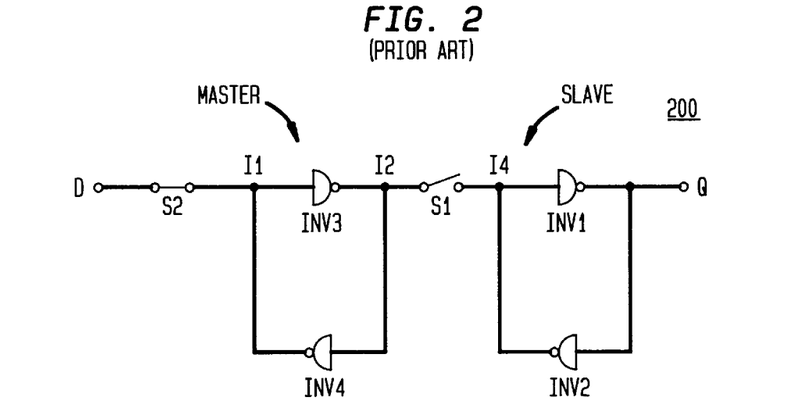
FIG. 2 shows a schematic drawing of a prior-art implementation of a master-slave flip-flop that relies on weak feedback techniques to retain data.

FIG. 2 shows a schematic drawing of a prior-art implementation of a master-slave flip-flop 200 that relies on weak feedback techniques to retain data. In flip-flop 200, inverters INV2 and INV4 are weak inverters that are designed to have a very small drive. As such, INV2 and INV4 are almost negligible under normal operating conditions, but will provide enough positive feedback during standby (i.e., when switches S1 and S2, respectively, are opened) to retain information in the flip-flop. Since INV2 and INV4 have very small drives, flip-flop 200 can be designed without switches (such as S2 and S4 of FIG. 1) in the feedback paths of the master and slave stages, since the input signals received at nodes I4 and I1 from nodes I2 and D, respectively, will be sufficiently large to control the state of inverters INV1 and INV3, no matter what signals are received from weak inverters INV2 and INV4, respectively.

Flip-flop 200 has certain advantages over flip-flop 100 of FIG. 1. First of all, flip-flop 200 has two fewer switches than flip-flop 100. Moreover, flip-flop 200 replaces two of the strong inverters of flip-flop 100 with two weak inverters. As such, flip-flop 200 has a smaller layout area and lower power dissipation than flip-flop 100.

Flip-flop 200 is not without problems, however. One important problem with flip-flop 200 relates to data shoot-through. As with flip-flop 100, switches S1 and S2 of flip-flop 200 are typically controlled by a two-phase clock. Since S1 and S2 need to be out of phase with one another (i.e., S1 is opened when S2 is closed, and vice versa), one standard technique is to use a received clock signal CK and an inverted version of the received clock signal (CKX) to control the states of the switches. In a simple implementation, the inverted clock signal CKX is generated by inverting the received clock signal CK using a standard inverter gate.

Because the inverter gate used to generate the inverted clock signal CKX is not an infinitely fast device, there will be a delay between the time when the received clock signal CK changes from one state to another (e.g., from low to high) and the time when the inverted clock signal CKX changes from one state to another (e.g., from high to low). During this delay period, depending upon the previous phase of the flip-flop, switches S1 and S2 may be either both opened or both closed for a short period of time. When switches S1 and S2 are both temporarily opened, there is no adverse impact to the operation of the flip-flop. However, when switches S1 and S2 are both temporarily closed, there is a possibility that the data received by the master stage will prematurely shoot through into the slave stage, thereby potentially corrupting the data generated at the output node Q.

This data shoot-through problem can be solved by adding relatively sophisticated circuitry to control very precisely the states of switches S1 and S2 to avoid the situation where switches S1 and S2 are both closed for too long a period of time. Such sophisticated circuitry adds to, rather than subtracts from, both layout area and power requirements. Moreover, such circuitry can adversely affect the speed of the flip-flop (i.e., slow it down).

SUMMARY OF THE INVENTION

The present invention is directed to an integrated circuit having a master-slave flip-flop comprising (a) a master stage having a master switch at its input and adapted to receive an input signal at one end and (b) a slave stage having a slave switch at its input and adapted to receive an output signal from the master stage, wherein the master and slave switches are adapted to be controlled by a three-phase clock, such that the master and slave switches are opened and closed to move data through the flip-flop.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Embodiments of the present invention are directed to application-tolerant flip-flops that overcome certain limitations of the existing art. In particular, a flip-flop of the present invention relies on a three-phase clock to control the switches within the flip-flop. In preferred embodiments, flip-flops of the present invention also rely on weak feedback techniques, similar to those of flip-flop 200 of FIG. 2. The internal three-phase clocking scheme addresses the shoot-through problem and eliminates the need for closely controlled clock signals. This allows a flip-flop of the present invention to be used as a direct replacement for existing art flip-flops, while allowing significant performance and layout improvements associated with weak feedback techniques.

The following discussion is for a negative-edge-triggered flip-flop. The technique described, however, applies analogously to positive-edge-triggered flip-flops, as well.

Figure 3:
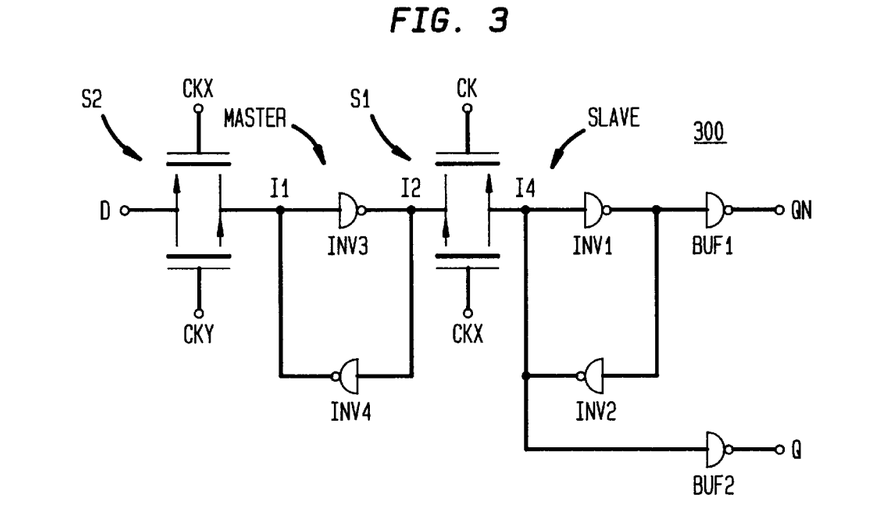
FIG. 3 shows a schematic diagram of a master-slave flip-flop, according to one embodiment of the present invention.

FIG. 3 shows a schematic diagram of a master-slave flip-flop 300, according to one embodiment of the present invention. Flip-flop 300 comprises inverters INV1–INV4, switches S1–S2, and output buffers BUF1–BUF2. Like flip-flop 200 of FIG. 2, in flip-flop 300, inverters INV2 and INV4 are weak inverters that enable flip-flop 300 to be designed without switches in its master and slave feedback paths. Each of switches S1 and S2 comprises a p-channel transistor in parallel with an n-channel transistor. Buffers BUF1 and BUF2 buffer the outputs Q and QN to isolate flip-flop 300 from subsequent circuitry. One important difference between prior-art flip-flop 200 and flip-flop 300 of the present invention relates to how switches S1 and S2 are controlled.

As described earlier, in prior-art flip-flop 200 of FIG. 2, the switches are controlled by a two-phase clock having clock signals CK and CKX. CK is an externally applied clock signal, and CKX is an internally generated clock signal generated by inverting CK. According to embodiments of the present invention, however, switches S1 and S2 of flip-flop 300 of FIG. 3 are controlled by a "three-phase" clock. This three-phase clock may be based on an externally generated clock signal CK, an internally generated inverted clock signal CKX generated from clock signal CK, and an internally generated third clock signal CKY generated by inverting the inverted clock signal CKX. As described in greater detail below, these three clock signals CK, CKX, and CKY are used to control the operations of switches S1 and S2, so as to avoid the data shoot-through problem of prior-art flip-flop 200. In other implementations, one or both of clock signals CKX and CKY may be generated external to flip-flop 300.

In particular, switch S1 comprises a p-channel transistor in parallel with an n-channel transistor, where CK is applied to the gate of the p-channel transistor and CKX is applied to the gate of the n-channel transistor. Similarly, switch S2 also comprises a p-channel transistor in parallel with an n-channel transistor, where CKX is applied to the gate of the p-channel transistor and CKY is applied to the gate of the n-channel transistor.

Those skilled in the art will understand that the output buffering of FIG. 3 is optional. The provision of two outputs Q and QN is also optional; there may be applications for which only one output is needed.

Figure 4:
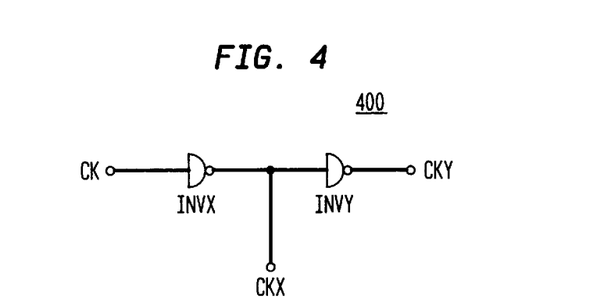
FIG. 4 shows a schematic diagram of a circuit that may be used to generate clock signals for the flip-flop of FIG. 3.

FIG. 4 shows a schematic diagram of a circuit 400 that may be used to generate clock signals CKX and CKY from the received clock signal CK, according to one embodiment of the present invention. As shown in FIG. 4, inverter INVX inverts received clock signal CK to generate inverted clock signal CKX, while inverter INVY inverts inverted clock signal CKX to generate the third clock signal CKY.

As shown in FIG. 3, clock signals CK and CKX are used to control switch S1, while clock signals CKX and CKY are used to control switch S2. Switch S1 is constrained to operate according to the following logic table:

| CK | CKX | S1 |
|---|---|---|
| High | Low | Opened |
| Low | Low | Closed |
| Low | High | Closed |
| High | High | Closed |

Similarly, switch S2 is constrained to operate according to the following logic table:

| CKX | CKY | S2 |
|---|---|---|
| Low | High | Closed |
| Low | Low | Closed |
| High | Low | Opened |
| High | High | Closed |

Figure 5:
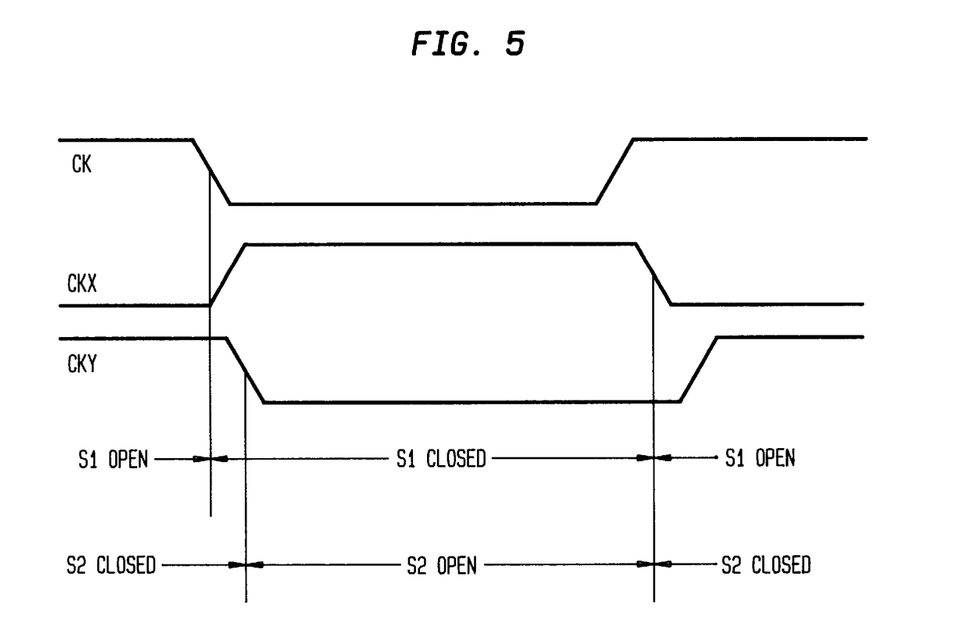
FIG. 5 shows a timing diagram that demonstrates the states of switches S1 and S2 of FIG. 3 as dictated by the states of clock signals CK, CKX, and CKY.

FIG. 5 shows a timing diagram that demonstrates the states of switches S1 and S2 as dictated by the states of clock signals CK, CKX, and CKY. Because inverters INVX and INVY of circuit 400 of FIG. 4 have finite response times, there are delays between the transitions of clock signals CK and CKX and between the transitions of clock signals CKX and CKY, respectively. These relative delays are shown in FIG. 5 for both sets of transitions (i.e., those based on CK going from high to low and those based on CK going from low to high).

Before the first set of transitions, CK is high, CKX is low, and CKY is high. According to the above S1 logic table, when CK is high and CKX is low, switch S1 is opened. Similarly, according to the above S2 logic table, when CKX is low and CKY is high, switch S2 is closed. As shown in FIG. 3, with S1 opened and S2 closed, data can be received by the master stage at node D.

During the first set of transitions, CK goes from high to low, CKX goes from low to high after a delay, and CKY goes from high to low after another delay. At some point, as CK goes from high to low, switch S1 will close (even before CKX becomes high), according to the S1 logic table. Similarly, as CKX goes from low to high and as CKY goes from high to low, switch S2 will open, but only after both CKX is high and CKY is low, according to the S2 logic table. This implies that there will be a time period during this first set of transitions in which both S1 and S2 are closed. This does not result in a data shoot-through problem, because it occurs at the beginning of the phase of operation of the flip-flop in which data is passed from the master stage to the slave stage. Data integrity in the master stage is guaranteed by the flip-flop specification relating to data hold time with respect to the clock. Having both switches closed for some period at the beginning of this phase merely allows the received data to pass through from the input node D directly to the slave stage.

Between the first set of transitions and the second set of transitions, CK is low, CKX is high, and CKY is low. According to the S1 logic table, when CK is low and CKX is high, switch S1 is closed. Similarly, according to the S2 logic table, when CKX is high and CKY is low, switch S2 is opened. As shown in FIG. 3, with S1 closed and S2 opened, data stored in the master stage is passed to the slave stage.

During the second set of transitions, CK goes from low to high, CKX goes from high to low after a delay, and CKY goes from low to high after another delay. At some point, as CK goes from low to high and as CKX goes from high to low, switch S1 will open, but only after both CK is high and CKX is low, according to the S1 logic table. Similarly, as CKX goes from high to low, switch S2 will close (even before CKY becomes high), according to the S2 logic table. Thus, S1 will open at the same time that S2 closes. As a result, during this phase of operations of the flip-flop, there is never a period when both switches S1 and S2 are closed. Therefore, there is no possibility of data shoot-through of new data received at input node D directly into the slave stage.

Figure 6A:
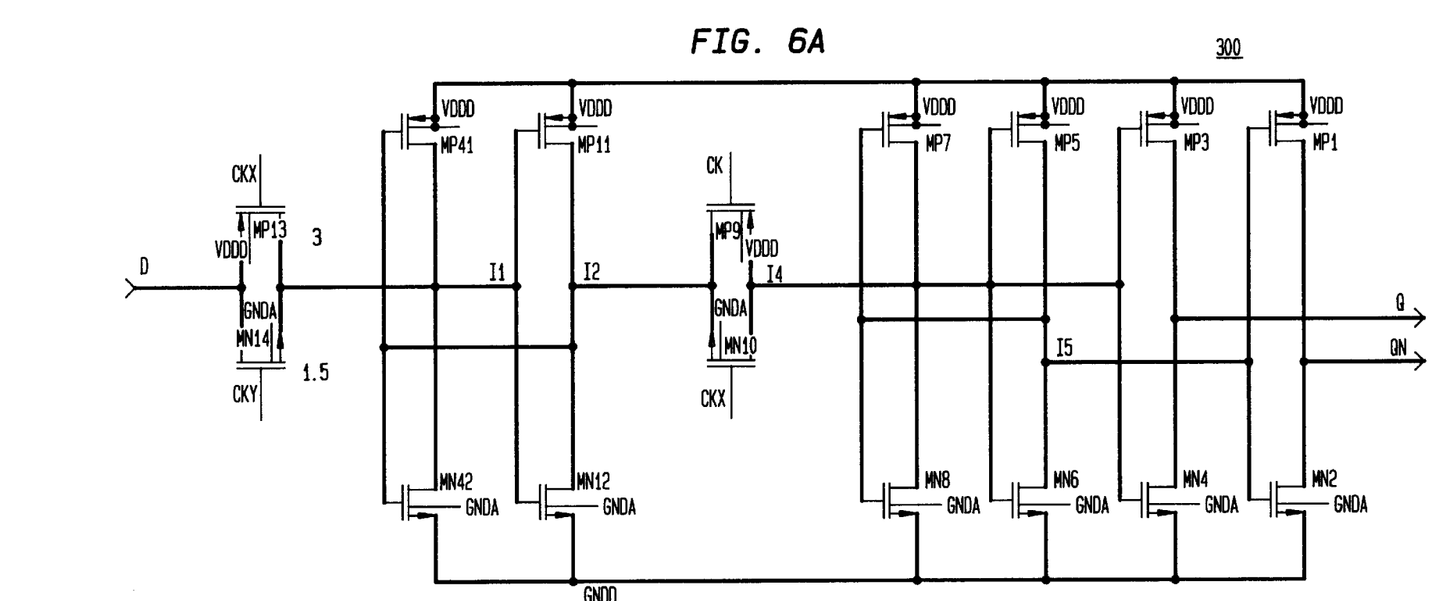
FIG. 6A shows a more detailed schematic diagram of the flip-flop of FIG. 3.

FIG. 6A shows a more detailed schematic diagram of flip-flop 300 of FIG. 3.

Figure 6B:
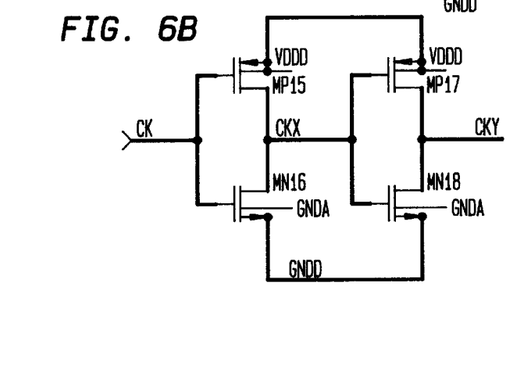
FIG. 6B shows a detailed schematic drawing of circuitry used to generate the clock signals CKX and CKY from the clock signal CK for the flip-flop of FIG. 6A.

FIG. 6B shows a detailed schematic drawing of circuitry used to generate the clock signals CKX and CKY from the clock signal CK for the flip-flop of FIG. 6A. The following elements of FIG. 6A correspond to those of FIG. 3 as follows:

o Transistors MP13 and MN14 of FIG. 6 correspond to switch S2 of FIG. 3;
 o Weak keeper transistors MP41 and MN42 correspond to weak inverter INV4;
 o Transistors MP11 and MN12 correspond to inverter INV3;
 o Transistors MP9 and MN10 correspond to switch S1;
 o Weak keeper transistors MP7 and MN8 correspond to weak inverter INV2;
 o Transistors MP5 and MN6 correspond to inverter INV1;
 o Transistors MP3 and MN4 correspond to buffer BUF1; and
 o Transistors MP1 and MN2 correspond to buffer BUF2.

Similarly, the remaining elements of FIG. 6A correspond to those of FIG. 4 as follows:

o Transistors MP15 and MN16 of FIG. 6A correspond to inverter INVX of FIG. 4; and
 o Transistors MP17 and MN18 correspond to inverter INVY.

In FIG. 6A, the channel width and length are identified for each transistor. For example, transistor MP41 of inverter INV4 has a width-to-length ratio of 0.6:3.0. The choice of device size is a function of minimum layout area. The minimum size device that can be constructed provides many orders of magnitude more drive current than is necessary to overcome any leakage that may affect nodes I1 or I4. The choice of minimum size devices for the weak keepers is also important to minimize the loading on nodes I1, I2, I4, and I5.

The ratio of sizes for the transistors used in inverters INVX and INVY are selected to minimize the occurrence of data shoot-through. For example, the ratio of sizes of transistors MP15 and MN16 generate an asymmetrical rise and fall of the clock signal CKX. CKX has a very fast rise and a slower fall time. This timing difference is important in preventing shoot-through errors. Similarly, the ratio of sizes of transistors MP17 and MN18 cause clock signal CKY to have a very fast fall and a slow rise time. These relative rise and fall times are indicated in the timing diagram of FIG. 5.

In one implementation of the flip-flop of FIG. 6A, the devices may be connected with thin-oxide interconnects, and contact windows at the devices' source and drain are not necessary. In addition, to maximize speed, it is advantageous to minimize the capacitance on node I1.

Flip-flops, like flip-flop 300 of FIGS. 3 and 6A, provide certain advantages over the existing designs. Because weak feedback techniques are employed, the layout area and power consumption of the flip-flops is relatively small, as compared to flip-flops, like flip-flop 100 of FIG. 1. Furthermore, the use of the three-phase clock provides a relatively simple and fast solution to the data shoot-through problem of flip-flops, like flip-flop 200 of FIG. 2. The resulting flip-flop is therefore fast and reliable and requires minimal layout area and power consumption.

Figures 7A, 7B, 7C:
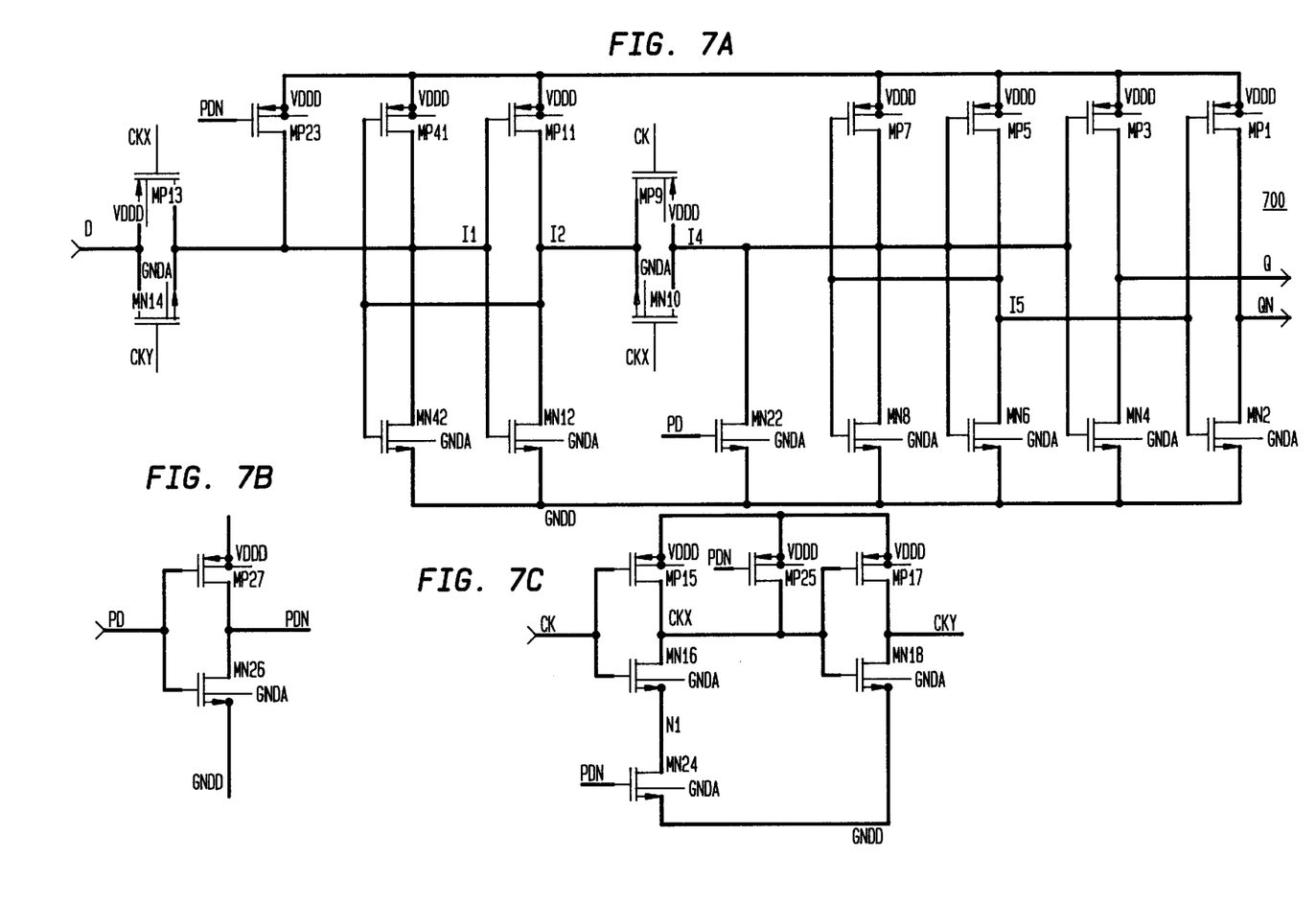
FIG. 7A shows a detailed schematic diagram of the flip-flop of FIG. 6A having additional circuitry to provide asynchronous presetting capability.
FIG. 7B shows a detailed schematic drawing of circuitry used to generate the preset signal PDN from the preset signal PD for the flip-flop of FIG. 7A.
FIG. 7C shows a detailed schematic drawing of circuitry used to generate the clock signals CKX and CKY from the clock signal CK and the preset signal PDN for the flip-flop of FIG. 7A.

FIG. 7A shows a detailed schematic diagram of asynchronous-preset flip-flop 700, according to another embodiment of the present invention. FIG. 7B shows a detailed schematic drawing of circuitry used to generate the preset signal PDN from the preset signal PD for the flip-flop of FIG. 7A; and FIG. 7C shows a detailed schematic drawing of circuitry used to generate the clock signals CKX and CKY from the clock signal CK and the preset signal PDN for the flip-flop of FIG. 7A. The design of flip-flop 700 is similar to that of flip-flop 300 of FIG. 6A, except that flip-flop 700 has additional circuitry consisting of transistors MN22, MP23, MN24, MP25, MN26, and MP27 that provides asynchronous presetting capability. The data path for flip-flop 700 is the same as that for flip-flop 300. No additional logic or gating stages have been added to the data path of presetable flip-flop 700.

The preset function has been implemented by adding a small pull-up device MP23 to node I1 and a small pull-down device MN22 to node I4. Devices MP25 and MN24 have been added to the clocking path to control the front-end pass devices MP13 and MN14. During a preset event (i.e., when preset signal PD goes high), the inverted clock signal CKX is forced high regardless of the state of the input clock signal CK, and the third clock signal CKY will then be forced low. Therefore, during a preset event, the front-end pass devices will be "OFF" and no conflict between the applied data and the internal preset data can occur on node I1. This is enabled by the use of the three-phase clocking scheme described earlier in conjunction with flip-flop 300.

During a preset event, the pull-up device MP23 needs only to overcome the weak drive of the master-stage feedback inverter INV4 consisting of MP41 and MN42, and the pull-down device MN22 needs only to overcome the weak drive of the slave-stage feedback inverter INV2 consisting of MP7 and MN8. These feedback inverters have very weak drive since the devices used to construct them are preferably minimum-channel-width, long-channel-length devices. Therefore, using small minimum-channel-length devices for the preset pull-up and pull-down devices will provide much more drive than necessary to over-ride the state held by the weak feedback inverters.

The pull-up and pull-down devices are sized to provide rapid transitions on the internal nodes of the flip-flop. Their sizes are chosen so that the response of the flip-flop to a preset is at least as fast as the existing art flip-flops. These constraints result in small minimum-channel-length devices that are virtually transparent during normal circuit operation. This results in a new family of flip-flops that are substantially improved over the existing art flip-flops.

The use of preset devices in both the master and slave stages provides a true asynchronous preset independent of the state of the input clock signal. The presetting of both the master and slave stages allows clock signal CK (which is directly applied to the slave-stage transfer gate and over which there is no control) to be a "DON'T CARE" signal during the preset event.

Figure 8A:
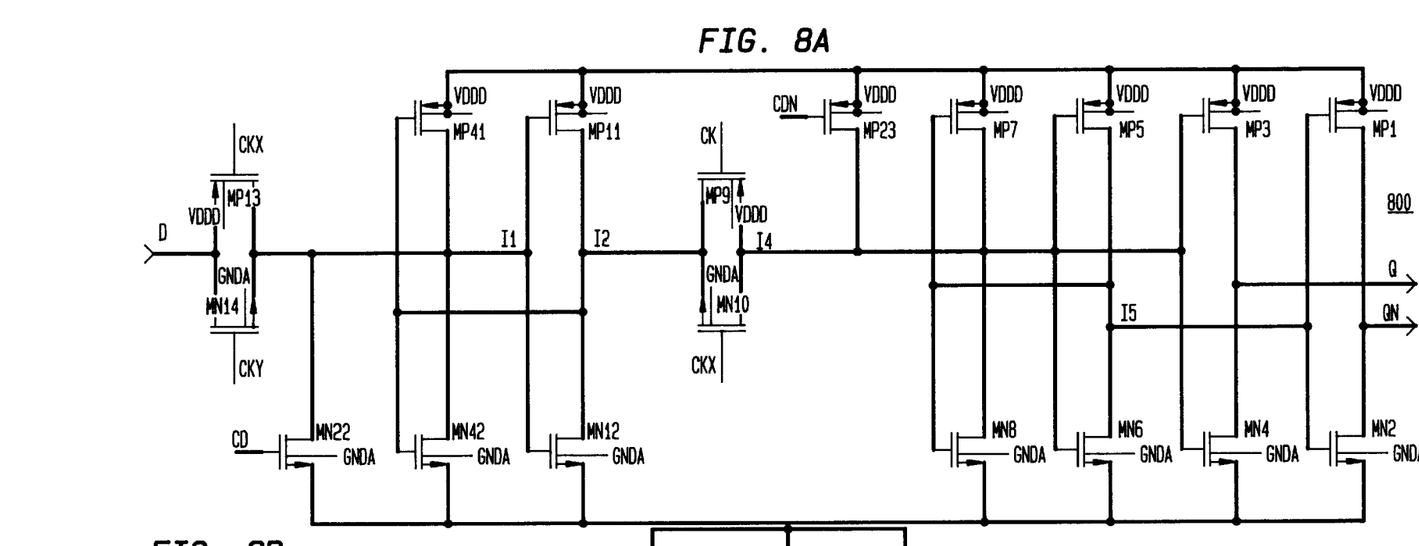
FIG. 8A shows a detailed schematic diagram of the flip-flop of FIG. 6A having additional circuitry to provide asynchronous clearing capability.
Figure 8B:
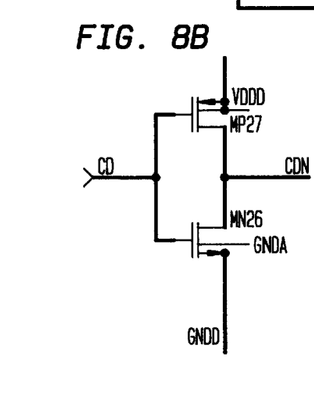
FIG. 8B shows a detailed schematic drawing of circuitry used to generate the clear signal CDN from the clear signal CD for the flip-flop of FIG. 8A.
Figure 8C:
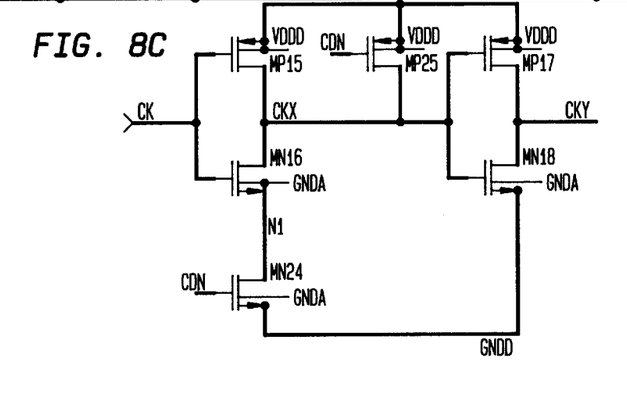
FIG. 8C shows a detailed schematic drawing of circuitry used to generate the clock signals CKX and CKY from the clock signal CK and the clear signal CDN for the flip-flop of FIG. 8A.

FIG. 8A shows a detailed schematic diagram of asynchronous-clear flip-flop 800, according to yet another embodiment of the present invention. FIG. 8B shows a detailed schematic drawing of circuitry used to generate the clear signal CDN from the clear signal CD for the flip-flop of FIG. 8A; and FIG. 8C shows a detailed schematic drawing of circuitry used to generate the clock signals CKX and CKY from the clock signal CK and the clear signal CDN for the flip-flop of FIG. 8A. The design of flip-flop 800 is similar to that of flip-flop 300 of FIG. 6A, except that flip-flop 800 has additional circuitry consisting of transistors MN22, MP23, MN24, MP25, MN26, and MP27 that provides asynchronous clearing capability. In this circuit, a pull-down device MN22 has been added to node I1 and a pull-up device MP23 has been added to node I4. These devices will implement the clear function to the data path (i.e., when the clear signal CD goes high). An identical modification has been made to the clock path of clearable flip-flop 800 as was made in the clock path of presetable flip-flop 700 of FIG. 7A. This modification prevents any data conflicts from occurring between the clear device MN22 and the applied data.

Figure 9A:
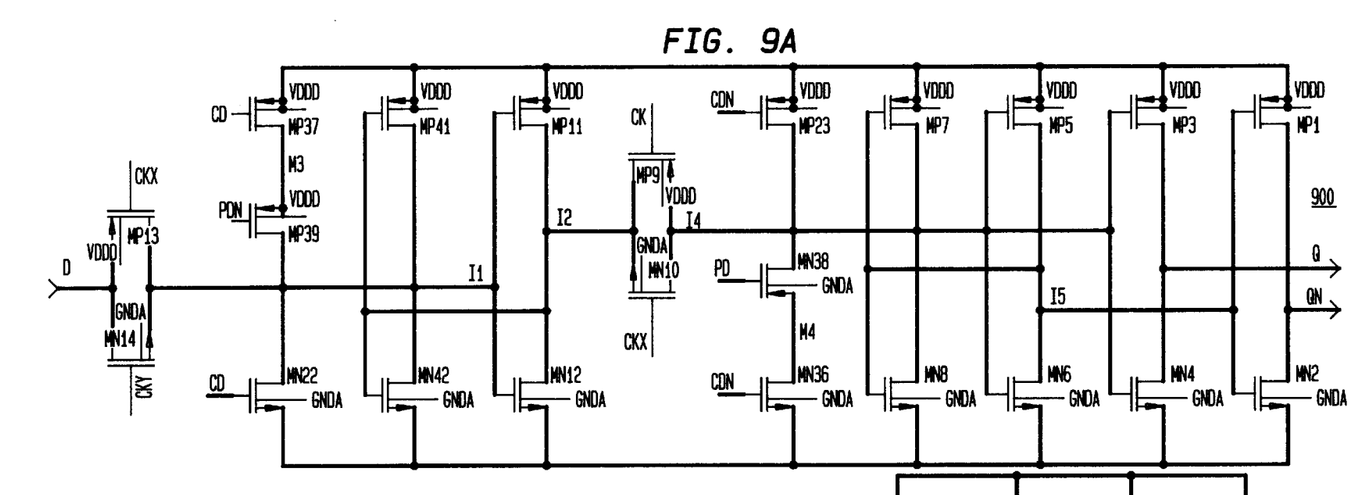
FIG. 9A shows a detailed schematic diagram of the flip-flop of FIG. 6A having additional circuitry to provide both asynchronous presetting and asynchronous clearing capabilities.
Figure 9B:
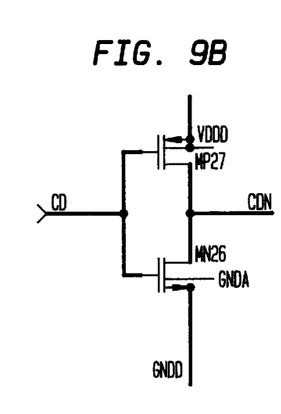
FIG. 9B shows a detailed schematic drawing of circuitry used to generate the clear signal CDN from the clear signal CD for the flip-flop of FIG. 9A.
Figure 9C:
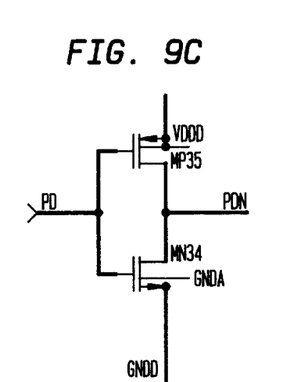
FIG. 9C shows a detailed schematic drawing of circuitry used to generate the preset signal PDN from the preset signal PD for the flip-flop of FIG. 9A.
Figure 9D:
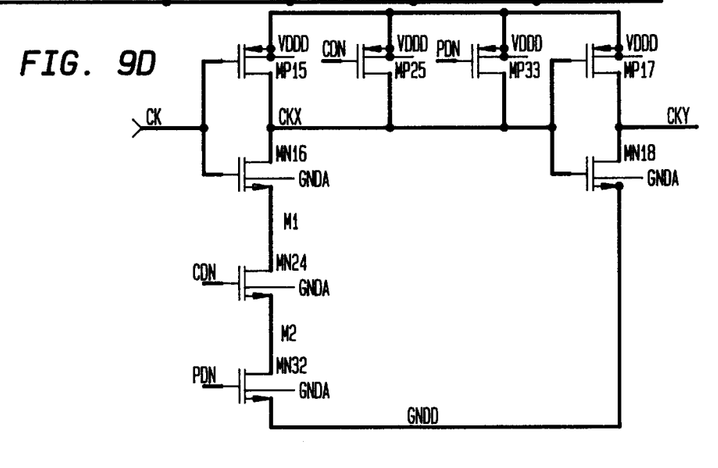
FIG. 9D shows a detailed schematic drawing of circuitry used to generate the clock signals CKX and CKY from the clock signal CK, the clear signal CDN, and the present signal PDN for the flip-flop of FIG. 9A.

FIG. 9A shows a detailed schematic diagram of presetable, clearable flip-flop 900, according to still another embodiment of the present invention. FIG. 9B shows a detailed schematic drawing of circuitry used to generate the clear signal CDN from the clear signal CD for the flip-flop of FIG. 9A; FIG. 9C shows a detailed schematic drawing of circuitry used to generate the preset signal PDN from the preset signal PD for the flip-flop of FIG. 9A; and FIG. 9D shows a detailed schematic drawing of circuitry used to generate the clock signals CKX and CKY from the clock signal CK, the clear signal CDN, and the present signal PDN for the flip-flop of FIG. 9A. The design of flip-flop 900 is similar to that of flip-flop 300 of FIG. 6A, except that flip-flop 900 has additional circuitry that provides both asynchronous presetting and asynchronous clearing capabilities. In order to implement a flip-flop with both preset and clear functions, a superposition of the two techniques of the flip-flops of FIGS. 7A and 8A is used. In this circuit, devices MP39 and MN38 implement the preset function on the data path, while devices MN22 and MP23 implement the clear function on the data path. Devices MP37 and MN36 have been added to prevent a data-path conflict between the clear and preset functions as well as to give the clear function priority over the preset function. This priority of "clear over preset" is typically implemented in existing art flip-flops for system applications.

Additional devices have been added to the clock circuitry to allow either preset or clear or both to control the internal clock signals CKX and CKY, thereby preventing data conflicts between the internal data and the applied data during either preset or clear or both.

The presetable and/or clearable application-tolerant flip-flops of FIGS. 7A, 8A, and 9A overcome limitations of the existing art by using the internally controlled three-phase clocking of flip-flop 300 of FIGS. 3 and 6A to control data-path conflicts (due to data shoot-through) without adding additional logic to the data path or slowing the clocking circuitry. According to this clocking scheme, logic is added to the clocking circuitry that is transparent in normal operation but allows the data-transfer gates to control data flow and prevent any data conflict. By controlling the data flow in this manner and by using weak-keeper devices to retain data, small preset and/or clear devices can be used in the data path to implement the asynchronous present and/or clear functions.

Like flip-flop 300, the flip-flops of FIGS. 7A, 8A, and 9A can be used as direct replacements for existing art flip-flops while allowing significant performance and layout improvements. In particular, the present invention (1) reduces area required by the flip-flop circuit, allowing chips to be smaller, (2) improves circuit performance, allowing higher frequency operations, (3) reduces power dissipation, allowing denser chips, and (4) reduces loading of driving circuitry, allowing more circuitry to be implemented on silicon.

The following tables provide some comparisons between the existing art flip-flops and flip-flops of the present invention.

TABLE I

PRESETABLE FLIP-FLOPS

|  | Flip-Flop 700 of FIG. 7A | Existing Art Flip-Flop |
|---|---|---|
| Layout Area | 14 grids | 19 grids |
| Relative Power | 60% | 100% |
| Set-up Time | 0.24 ns | 0.43 ns |
| Clock-Output Delay | 0.48 ns | 0.53 ns |

TABLE II

CLEARABLE FLIP-FLOPS

|  | Flip-Flop 800 of FIG. 8A | Existing Art Flip-Flop |
|---|---|---|
| Layout Area | 14 grids | 20 grids |
| Relative Power | 60% | 100% |
| Set-up Time | 0.23 ns | 0.44 ns |
| Clock-Output Delay | 0.49 ns | 0.68 ns |

TABLE III

PRESETABLE, CLEARABLE FLIP-FLOPS

|  | Flip-Flop 900 of FIG. 9A | Existing Art Flip-Flop |
| --- | --- | --- |
| Layout Area | 20 grids | 24 grids |
| Relative Power | 65% | 100% |
| Set-up Time | 0.22 ns | 0.49 ns |
| Clock-Output Delay | 0.49 ns | 0.58 ns |

The tables show the most critical parameters when using the flip-flops in high-speed applications. In all cases, the application-tolerant weak-keeper flip-flops of the present invention offer better performance with lower power and smaller area than the existing art flip-flops.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a master-slave flip-flop and a clock circuit, the master-slave flip-flop comprising:
   (a) a master stage having a master switch at its input, wherein the master switch is adapted to receive an input signal at one end; and
   (b) a slave stage having a slave switch at its input, wherein the slave switch is adapted to receive an output signal from the master stage, wherein the master and slave switches are controlled by three clock signals from the clock circuit, such that the master and slave switches are opened and closed to move data, corresponding to the input signal, through the flip-flop, wherein at least one of the clock signals has asymmetrical rise and fall times.

2. The invention of claim 1, wherein:
   the master stage comprises a first master inverter and a second master inverter connected in a feedback path of the first master inverter; and
   the slave stage comprises a first slave inverter and a second slave inverter connected in a feedback path of the first slave inverter.

3. The invention of claim 2, wherein the second master inverter and the second slave inverter are weak keeper devices.

4. The invention of claim 2, wherein each inverter comprises a P-channel transistor and an N-channel transistor connected in series.

5. The invention of claim 1, wherein each of the master switch and the slave switch comprises a P-channel transistor and an N-channel transistor connected in parallel.

6. The invention of claim 1, wherein the clock circuit is adapted to receive a clock signal CK and to generate an inverted clock signal CKX, which is an inverted version of the clock signal CK, and a third clock signal CKY, which is an inverted version of the inverted clock signal CKX, wherein the clock signals CK, CKX, and CKY control the master and slave switches.

7. The invention of claim 6, wherein the clock signals CK and CKX control the slave switch, and the clock signals CKX and CKY control the master switch.

8. The invention of claim 6, wherein the clock circuit comprises a first inverter, adapted to generate the inverted clock signal CKX from the clock signal CK, and a second inverter, adapted to generate the third clock signal CKY from the inverted clock signal CKX.

9. The invention of claim 8, wherein the first inverter comprises a P-channel transistor and an N-channel transistor connected in series, and the second inverter comprises a P-channel transistor and an N-channel transistor connected in series.

10. The invention of claim 9, wherein the sizes of the transistors in the first and second inverters are selected such that the rise and fall times of the clock signals CKX and CKY are asymmetrical.

11. The invention of claim 10, wherein, for the clock signal CKX, the rise time is faster than the fall time, and, for the clock signal CKY, the rise time is slower than the fall time.

12. The invention of claim 1, wherein the three clock signals control the master and slave switches to reduce chances of data shoot-through in the flip-flop.

13. The invention of claim 1, wherein the master and slave stages employ a weak feedback technique.

14. The invention of claim 1, wherein the master stage has a pull-up device and the slave stage has a pull-down device that combine to provide resetting capability.

15. The invention of claim 1, wherein the master stage has a pull-down device and the slave stage has a pull-up device that combine to provide clearing capability.

16. The invention of claim 1, wherein gating is applied to the clock circuit to provide at least one of asynchronous resetting capability and asynchronous clearing capability.

17. The invention of claim 1, wherein:
   the master stage comprises a first master inverter and a second master inverter connected in a feedback path of the first master inverter;
   the slave stage comprises a first slave inverter and a second slave inverter connected in a feedback path of the first slave inverter;
   the second master inverter and the second slave inverter are weak keeper devices;
   each inverter comprises a P-channel transistor and an N-channel transistor connected in series;
   each of the master switch and the slave switch comprises a P-channel transistor and an N-channel transistor connected in parallel;
   the three clock signals control the master and slave switches to reduce chances of data shoot-through in the flip-flop;
   the master stage has a pull-up device and the slave stage has a pull-down device that combine to provide resetting capability;
   the master stage has a pull-down device and the slave stage has a pull-up device that combine to provide clearing capability;
   gating is applied to the clock circuit to make the resetting and clearing capabilities asynchronous; and
   the clock circuit is adapted to receive a clock signal CK and to generate an inverted clock signal CKX, which is an inverted version of the clock signal CK, and a third clock signal CKY, which is an inverted version of the inverted clock signal CKX, wherein:
   the clock signals SK and CKX control the slave switch;
   the clock signals CKX and CKY control the master switch;
   the clock circuit comprises a first inverter, adapted to generate the inverted clock signal CKX from the clock signal CK, and a second inverter, adapted to generate the third clock signal CKY from the inverted clock signal CKX;

the first inverter comprises a P-channel transistor and an N-channel transistor connected in series, and the second inverter comprises a P-channel transistor and an N-channel transistor connected in series; and the sizes of the transistors in the first and second inverters are selected such that the rise and fall times of the clock signals CKX and CKY are asymmetrical such that for the clock signal CKX, the rise time is faster than the fall time, and, for the clock signal CKY, the rise time is slower than the fall time.

* * * * *